United States Patent
Steiner

(10) Patent No.: US 10,136,549 B2
(45) Date of Patent: Nov. 20, 2018

(54) FAN SPEED CONTROL DEVICE

(71) Applicant: Lutron Electronics Co., Inc., Coopersburg, PA (US)

(72) Inventor: James P. Steiner, Royersford, PA (US)

(73) Assignee: Lutron Electronics Co., Inc., Coopersburg, PA (US)

( * ) Notice: Subject to any disclaimer, the term of this patent is extended or adjusted under 35 U.S.C. 154(b) by 0 days.

(21) Appl. No.: 15/584,958

(22) Filed: May 2, 2017

(65) Prior Publication Data

US 2017/0318701 A1  Nov. 2, 2017

Related U.S. Application Data

(60) Provisional application No. 62/330,596, filed on May 2, 2016.

(51) Int. Cl.
*H05K 7/20* (2006.01)
*F04D 27/00* (2006.01)
(Continued)

(52) U.S. Cl.
CPC ....... *H05K 7/20209* (2013.01); *F04D 27/004* (2013.01); *F24F 11/30* (2018.01);
(Continued)

(58) Field of Classification Search
CPC ......... F04D 27/004; F24F 11/30; F24F 11/56; F24F 11/58; F24F 11/65; F24F 2110/10; G05B 2219/23133; H05K 7/20209
See application file for complete search history.

(56) References Cited

U.S. PATENT DOCUMENTS 5,996,898 A * 12/1999 Parker ................... F04D 25/088
236/51
7,330,004 B2  2/2008 DeJonge et al.
(Continued)

FOREIGN PATENT DOCUMENTS

WO  WO 2015168127 A1  11/2015

OTHER PUBLICATIONS

American Society of Heating, Refrigerating and Air-Conditioning Engineers, Inc., ANSI/ASHRAE Standard 55:2010, Thermal Environmental Conditions for Human Occupancy, 2010, pp. 4-7, Atlanta, GA.

(Continued)

*Primary Examiner* — Muhammad S Islam
(74) *Attorney, Agent, or Firm* — Glen Farbanish; Amy Yanek; Philip Smith

(57) ABSTRACT

A control device for a ceiling fan may have a motor drive circuit configured to control a rotational speed of a motor of the ceiling fan, an occupancy sensing circuit, and a control circuit configured to adjust the rotational speed of the motor in response to a detected occupancy or vacancy condition. The control circuit may process the signals generated by the occupancy sensing circuit to eliminate the effects of vibrations and/or wobbling of the ceiling fan. The control circuit may control the motor drive circuit to adjust the rotational speed of the motor in response to an accelerometer to minimize the magnitude of the wobble of the ceiling fan. The control circuit may be configured to learn a preferred rotational speed for the motor. The control circuit may also be configured to control the rotational speed of the motor to affect a thermal comfort level of an occupant.

26 Claims, 9 Drawing Sheets

(51) Int. Cl.
   G05D 23/19     (2006.01)
   H02P 6/00      (2016.01)
   F24F 11/30     (2018.01)
   *F24F 110/10*      (2018.01)
   *F24F 11/65*       (2018.01)
   *F24F 11/56*       (2018.01)
   *F24F 11/58*       (2018.01)

(52) U.S. Cl.
   CPC ........... G05D 23/1919 (2013.01); H02P 6/00 (2013.01); *F24F 11/56* (2018.01); *F24F 11/58* (2018.01); *F24F 11/65* (2018.01); *F24F 2110/10* (2018.01); *G05B 2219/23133* (2013.01)

(56) References Cited

U.S. PATENT DOCUMENTS

| | | |
|---|---|---|
| 7,489,094 B2 | 2/2009 | Steiner et al. |
| 7,839,109 B2 | 11/2010 | Carmen et al. |
| 8,068,014 B2 | 11/2011 | Steiner et al. |
| 8,228,184 B2 | 7/2012 | Blakeley et al. |
| 8,901,769 B2 | 12/2014 | Altonen et al. |
| 8,950,461 B2 | 2/2015 | Adams et al. |
| 9,309,012 B1 | 4/2016 | Kilgore et al. |
| 2006/0117769 A1* | 6/2006 | Helt .............. F24F 11/0001 62/161 |
| 2008/0092075 A1 | 4/2008 | Jacob et al. |
| 2009/0162197 A1 | 6/2009 | Klemo et al. |
| 2014/0084165 A1 | 3/2014 | Fadell et al. |
| 2014/0265568 A1 | 9/2014 | Crafts et al. |
| 2014/0266669 A1 | 9/2014 | Fadell et al. |
| 2016/0018119 A1* | 1/2016 | Desmet .............. F04D 25/088 165/237 |
| 2017/0171941 A1 | 6/2017 | Steiner |

OTHER PUBLICATIONS

Innova Airtech Instruments A/S, Thermal Comfort, Mar. 18, 1997, pp. 1-25.

\* cited by examiner $$[1]\ M - W = H + E_C + C_{res} + E_{res}$$

$$[2]\ E_C = 3.05 \cdot 10^{-3} \cdot (5733 - 6.99 \cdot (M - W) - p_a) + 0.42 \cdot ((M - W) - 58.15)$$

$$[3]\ C_{res} = 0.0014 \cdot M \cdot (34 - t_a)$$

$$[4]\ E_{res} = 1.7 \cdot 10^{-5} \cdot M \cdot (5867 - p_a)$$

$$[5]\ H = \frac{(35.7 - 0.028 \cdot (M - W)) - t_{cl}}{I_{cl}}$$

$$[6]\ t_{cl} = (35.7 - 0.028 \cdot M) - 40 \cdot 10^{-9} \cdot f_{cl} \cdot I_{cl} \cdot [(t_{cl} + 273)^4 - (t_r + 273)^4]$$
$$- f_{cl} \cdot I_{cl} \cdot h_c \cdot (t_{cl} - t_a)$$

$$[7]\ h_c = \begin{bmatrix} 2.38 \cdot (t_{cl} - t_a)^{0.25} & \text{for}\ 2.38 \cdot (t_{cl} - t_a)^{0.25} > 12.1 \cdot \sqrt{v_{ar}}, \\ 12.1 \cdot \sqrt{v_{ar}} & \text{all other values} \end{bmatrix}$$

$$[8]\ PMV = (0.303 \cdot e^{-0.036 \cdot M} + 0.028) \cdot [M - W - H - E_C - C_{res} - E_{res}]$$

$$[9]\ PPD = 100 - 95 \cdot e^{-(0.03353\ PMV^4 + 0.2179 \cdot PMV^2)}$$

Fig. 7

FAN SPEED CONTROL DEVICE

CROSS-REFERENCE TO RELATED APPLICATION

This application claims the benefit of U.S. Provisional Patent Application No. 62/330,596, filed May 2, 2016, the entire disclosure of which is incorporated by reference herein.

BACKGROUND

A user environment, such as a residence or an office building for example, may be configured using various types of load control systems. A lighting control system may be used to control the lighting loads in the user environment. A motorized window treatment control system may be used to control the natural light provided to the user environment. A heating, ventilation, and air-conditioning (HVAC) system may be used to control the temperature in the user environment. Each load control system may include various control devices, including control-source devices and control-target devices. The control-target devices may receive digital messages, which may include load control instructions, for controlling an electrical load from one or more of the control-source devices. The control-target devices may be capable of directly controlling an electrical load. The control-source devices may be capable of indirectly controlling the electrical load via the control-target devices. Examples of control-target devices may include lighting control devices (e.g., a dimmer switch, an electronic switch, a ballast, or a light-emitting diode (LED) driver), a control device (e.g., for a ceiling fan or exhaust fan), a motorized window treatment, a temperature control device (e.g., a thermostat), an AC plug-in load control device, and/or the like. Examples of control-source devices may include remote control devices, occupancy sensors, daylight sensors, temperature sensors, and/or the like.

SUMMARY

As described herein, a control device for a ceiling fan may have a motor drive circuit configured to control a rotational speed of a motor of the ceiling fan, an occupancy sensing circuit, and a control circuit configured to detect an occupancy condition or a vacancy condition in a space in response to the occupancy sensing circuit and/or to control the motor drive circuit to adjust the rotational speed of the motor in response to the detected occupancy or vacancy condition. The occupancy sensing circuit may comprise a passive infrared (PIR) sensing circuit configured to generate a sense signal that indicates the occupancy condition or a vacancy condition in the space. The occupancy sensing circuit may also comprise an image sensing circuit, for example, a thermopile array or an image processor that is responsive to an image sensing circuit (e.g., a camera) for recording an image of the space.

The control circuit of the control device may be configured to process the signals generated by the occupancy sensing circuit(s) to eliminate the effects of vibrations and/or wobbling of the ceiling fan. The control device may comprise a movement sensing device (e.g., an accelerometer) configured to generate an output signal that indicates a magnitude of vibrations and/or wobbling of the ceiling fan. For example, the control circuit may be configured to process the sense signal from the PIR sensing circuit and the output signal using an adaptive noise cancelling algorithm to eliminate the effects of the vibrations and/or wobbling of the ceiling fan on the sense signal. In addition, the control circuit may be configured to process image sensing signals from the image sensing circuit using a stabilization algorithm to eliminate the effects of the vibrations and/or wobbling of the ceiling fan on the image sensing signals.

The control circuit may be configured to control the motor drive circuit to adjust the rotational speed of the motor in response to the accelerometer output signal to minimize the magnitude of the wobble of the ceiling fan. The control circuit may be configured to control the motor drive circuit to adjust the rotational speed of the motor to avoid rotational speeds at which the wobble is greatest. The control circuit may be configured to learn the rotational speeds of the motor at which the wobble is greatest during a configuration and/or setup procedure of the control device.

The control circuit may be configured to learn a preferred rotational speed for the motor. For example, the control circuit may be configured to learn the preferred rotational speed for the motor in response to repeatedly receiving a command to control the motor to a particular rotational speed. The control circuit may be configured to learn the preferred rotational speed for the motor in response to the received commands along with other information, such as a present temperature of the space and/or a time of the day.

The control circuit may also be configured to control the rotational speed of the motor to affect a thermal comfort level of an occupant. The control circuit may be configured to calculate a thermal comfort level of an occupant of the space using one or more of a level of human activity of the occupant (e.g., as determined from the occupancy sensing circuits), a present air temperature measured by a temperature sensing circuit, a humidity level measured by a humidity sensing circuit, information (e.g., including time of day, time of year, geographical location, and weather conditions) received by a communication circuit, and the rotational speed of the motor. The control circuit may be further configured to control the rotational speed of the motor of the ceiling fan in response to the calculated thermal comfort level to provide air flow that provides the best comfort.

BRIEF DESCRIPTION OF THE DRAWINGS

FIG. 7 is a list of equations including the predicted mean vote (PMV) equation that may be used to automatically adjust a fan speed to increase thermal comfort of the occupant.

DETAILED DESCRIPTION

Figure 1:
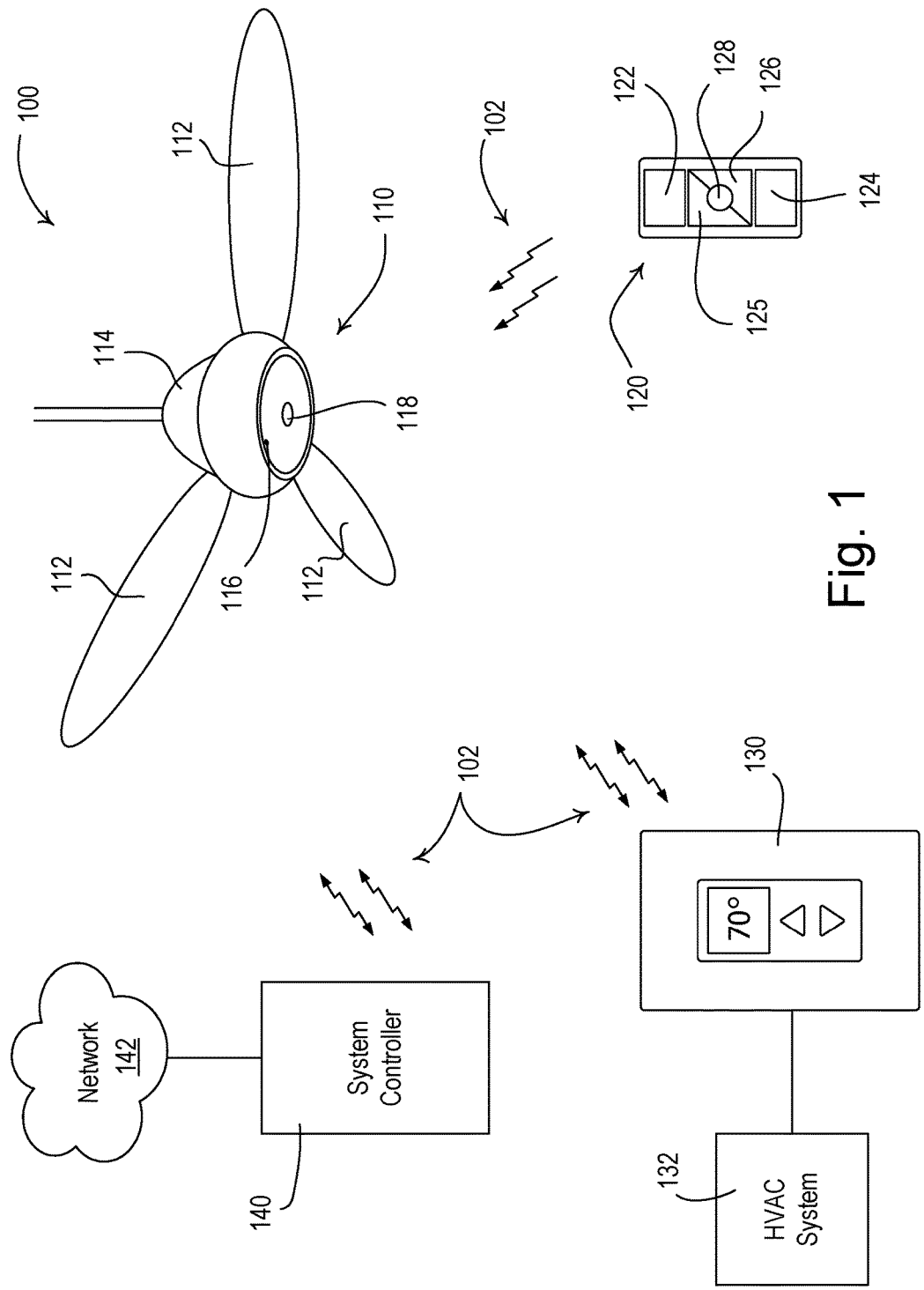
FIG. 1 is a diagram of an example load control system for controlling the operation of an electrical device, such as a ceiling fan.

FIG. 1 is a diagram of an example load control system 100 for controlling the operation of an electrical device, such as a ceiling fan 110. The ceiling fan 110 may receive power from a power source, such as an alternating-current (AC) power source or a direct-current (DC) power source. The ceiling fan 110 may be installed on the ceiling of a room or space in a building. The ceiling fan 110 may include a plurality of blades 112 (e.g., three blades as shown in FIG. 1) that may be rotated by a motor of the ceiling fan to circulate the air in the room. The ceiling fan 110 may also include a control device or circuit that may be housed in a base portion 114 and/or may control the rotational speed and direction of rotation of the motor.

The control device of the ceiling fan 110 may be configured to receive wired or wireless signals, such as radio-frequency (RF) signals 102, for controlling the operation of the motor. The load control system 100 may comprise a remote control device 120 (e.g., a battery-powered RF remote control) for transmitting RF signals 102 including commands for controlling the ceiling fan in response to actuations of a plurality of buttons, e.g., an on button 122, an off button 124, an increase speed button 125, a decrease speed button 126, and a preset button 128. The control device of the ceiling fan 110 may be configured to turn the motor on and off in response to actuations of the on and off buttons 122, 124 of the remote control device 120, respectively. The control device of the ceiling fan 110 may be configured to increase and decrease the rotational speed of the motor by a predetermined amount in response to actuations of the increase speed button 125 and the decrease speed button 126, respectively. The control device of the ceiling fan 110 may be configured to adjust the rotational speed of the motor to a preset rotational speed in response to an actuation of the preset button 128. The control device may be further configured to adjust the direction of rotation of the motor in response to an actuation of one of the buttons 122-128 (or other button(s)) of the remote control device 120. One will recognize that the control device of the ceiling fan 110 may also and/or alternatively be configured to receive control signals from a control device via a wired communication link.

The load control system 100 may comprise one or more temperature control devices, e.g., a thermostat 130 for controlling a room temperature in the room in which the ceiling fan is installed. The thermostat 130 may be coupled to a heating, ventilation, and air conditioning (HVAC) system 132 via a control link (e.g., an analog control link) or a digital communication link (e.g., a wired or wireless digital communication link) and may be configured to communicate digital messages with a controller of the HVAC system. The thermostat 130 may comprise an internal temperature sensor for measuring the present temperature of the room and may control the HVAC system 132 to adjust the present temperature in the room towards a setpoint temperature. The ceiling fan 110 may also comprise a temperature sensor configured to measure the present temperature of the room (e.g., via a vent 116) and/or a humidity sensor configured to measure a present humidity level in the room. The control device of the ceiling fan 110 may be configured to transmit the measured temperature and/or measured humidity level to the thermostat 130 via the RF signals 102 (or alternatively, via a wired communication link). The HVAC system 132 may be configured to turn a compressor on and off for cooling the room and to turn a heating source on and off for heating the rooms in response to the control signals received from the thermostat 130. The HVAC system 132 may be configured to turn a fan of the HVAC system on and off in response to the control signals received from the thermostat 130. The thermostat 130 may be configured to transmit the present mode of the HVAC system 132 (e.g., heating or cooling) to the ceiling fan 110, and the control device may be configured to adjust the rotational speed and/or direction of rotation of the blades 112 in response to the mode of the HVAC system 132. As another example, the control device of the ceiling fan may be configured to receive from the thermostat 130 the present temperature and/or present humidity level in the room as measured by the thermostat 130, such as if the ceiling fan does not comprise such sensors.

The load control system 100 may comprise a system controller 140 (e.g., a central processor or load controller) configured to communicate digital messages to and from the control devices of the load control system (e.g., the ceiling fan 110, the remote control device 120, and/or the thermostat 130). The system controller 140 may be configured to be coupled to a network 142, such as a wireless or wired local area network (LAN), e.g., for access to the Internet. The system controller 140 may be wirelessly connected to the network, e.g., using Wi-Fi technology. The system controller 140 may be coupled to the network via a network communication bus (e.g., an Ethernet communication link). The system controller 140 may be configured to communicate via the network with one or more network devices, e.g., a mobile device, such as, a personal computing device and/or a wearable wireless device. Examples of load control systems operable to communicate with mobile and/or network devices on a network are described in greater detail in commonly-assigned U.S. Patent Application Publication No. 2013/0030589, published Jan. 31, 2013, entitled LOAD CONTROL DEVICE HAVING INTERNET CONNECTIVITY, the entire disclosure of which is hereby incorporated by reference.

The system controller 140 may be configured to transmit information (wirelessly and/or via a wired communication link) (e.g., a time of day and/or year, geographical location, weather information, etc.) to the ceiling fan, and the control device of the fan may be configured to adjust the rotational speed and/or direction of rotation of the motor in response to the information received from the system controller.

The operation of the load control system 100 (including the ceiling fan 110) may be programmed and configured using, for example, the mobile device or other network device (e.g., when the mobile device is a personal computing device). The mobile device may execute a graphical user interface (GUI) configuration software for allowing a user to program how the load control system 100 will operate. For example, the configuration software may run as a PC application or a web interface. Examples of configuration procedures for load control systems are described in greater detail in commonly-assigned U.S. Pat. No. 7,391,297, issued Jun. 24, 2008, entitled HANDHELD PROGRAMMER FOR A LIGHTING CONTROL SYSTEM; U.S. Patent Application Publication No. 2008/0092075, published Apr. 17, 2008, entitled METHOD OF BUILDING A DATABASE OF A LIGHTING CONTROL SYSTEM; and U.S. Patent Application Publication No. 2014-0265568, filed Mar. 14, 2013, entitled COMMISSIONING LOAD CONTROL SYSTEMS, the entire disclosures of which are hereby incorporated by reference.

The control device of the ceiling fan 110 may include one or more internal occupancy sensing circuits for detecting an occupancy and/or vacancy condition in the space in which the ceiling fan 110 is located. The control device of the ceiling fan 110 may include a passive infrared (PIR) sensing circuit including, for example, a pyroelectric infrared detector for receiving infrared energy of an occupant that is moving in the space through a lens 118 of the ceiling fan 110. The control device of the ceiling fan 110 may include an image sensing circuit including, for example, a thermopile array or an image capturing circuit (e.g., a camera) for recording an image of the space through, for example, the lens 118. Vibrations and wobbling of the ceiling fan may introduce interference (e.g., noise) into the signals generated by the internal occupancy sensing circuits. The control device may include a movement sensing device (e.g., an accelerometer) for determining a magnitude and direction of the vibrations and wobbling of the ceiling fan 110. The accelerometer may be internally integrated in the control device. The control device may be configured to use an adaptive noise cancelling algorithm and/or an image stabilization algorithm to reduce the effects of the noise (e.g., the vibrations and wobbling) on the signals generated by the occupancy sensor circuits. In general, the control device of the ceiling fan 110 may use detected occupancy and/or vacancy conditions in the space to control the rotational speed and/or direction of rotation of the fan motor. The control device of the ceiling fan 110 may also communicate the detected occupancy and/or vacancy conditions in the space to other devices of load control system 100, such as system controller 140, thermostat 130, etc., which may use the detected conditions to control the system.

In one or more examples, the control device of the ceiling fan may include a control circuit. The control circuit may be configured to process a PIR sense signal that is received from the PIR sensing circuit to minimize the effects of noise on the PIR sense signal. As described herein, the noise may be caused by the wobbling/vibrations of the ceiling fan and measured by the accelerometer, for example. The control circuit may use an adaptive noise cancelling algorithm to subtract the noise from the PIR sense signal. The adaptive noise cancelling algorithm may include a noise cancellation filter (e.g., an adaptive filter). The adaptive filter may adjust its impulse response to minimize an error signal based on a feedback loop and/or using a root mean square function. The error signal may increase or decrease in response to a filter output. For example, the PIR sensor may measure a primary signal that is corrupted by noise caused by wobbling of the fan (e.g., a primary signal). A summing device may be used to compare the primary signal with a filtered noise signal produced by the adaptive filter.

The adaptive filter may adjust the filtered noise signal based on a feedback loop. The feedback loop may generate an error signal that indicates a match or a mismatch between the PIR sense signal and the noise signal (e.g., in phase and amplitude). The adaptive filter may adjust an impulse response to minimize the error signal via a mean square approach. In the mean square approach, the error signal may increase or decrease in response to an output of the adaptive filter. For example, a Least Mean Square (LMS) algorithm may be used to adjust the filtering and the impulse response.

The control circuit may calibrate the PIR sense signal in an unoccupied space with a wobbling fan using the LMS algorithm. The PIR sense signal (i.e., detection of occupancy) may be generated by the motion detected by the moving/wobbling of the PIR sensor. The wobbling may also be measured by the accelerometer and indicated by the accelerometer output signal. The PIR sense signal may be sinusoidal, and the accelerometer output signal may also be sinusoidal. The PIR sense signal and the accelerometer output signal may have the same frequency but differ in amplitude and/or phase. The LMS filter that minimizes the mismatch between the PIR sense signal and the accelerometer output signal may adjust filter coefficients so that the PIR sense signal and the accelerometer output signal may have a matching amplitude and/or phase. For example, the amplitude and/or phase of the PIR sense signal may be the same as those of the accelerometer output signal. When the PIR sense signal and/or the accelerometer output signal are not sinusoidal (e.g., with uncorrelated random noise), the LMS filter may adjust the filter coefficients to minimize the error signal (e.g., a mean square error). The minimized error signal may correspond to a set of filter coefficients that may be used to match the PIR sense signal and the accelerometer output signal so the error signal is zero, for example.

Once the filter coefficients have been determined, the calibration routine may end and the adaptive filter may be used during normal operation with the determined filter coefficients. The PIR sense signal may include two components, a first component indicating the occupancy of the space and a second noise component introduced by the wobbling of the fan. The second component may also be indicated by the accelerometer output signal. The accelerometer output signal, after being filtered using the set of filter coefficients determined during the calibration routine, may be subtracted from the PIR sense signal, leaving the first component indicating the occupancy of the space.

According to another and/or additional example, the control device of the ceiling fan 110 may be configured to adjust the rotational speed of the motor to minimize the magnitude of the wobble of the ceiling fan. For example, the control device may be configured to adjust the rotational speed of the motor to avoid rotational speeds at which the wobble is greatest. The control device may be configured to determine (e.g., learn) the rotational speeds of the motor at which the wobble is greatest during a configuration and/or setup procedure of the ceiling fan 110 as will be described in greater detail below.

According to another and/or additional example, the control device of the ceiling fan 110 may be configured to learn a preferred rotational speed for the motor. For example, the control device may be configured to learn a preferred rotational speed for the motor based on use of the ceiling fan 110 (e.g., frequent and/or repeated commands received from the remote control device 120) and possibly also the present temperature in the space as measured by the internal temperature sensing circuit (or an external temperature sensing circuit such as thermostat 130). In addition, the control device may be configured to learn a preferred rotational speed for the motor based on use of the ceiling fan 110 (e.g., frequent and/or repeated commands received from the remote control device 120) and the present time of day (e.g., as received from the system controller 140). Here again present temperature in the space may also be used.

According to another and/or additional example, the control device of the ceiling fan 110 may be configured to control the rotational speed and/or direction of rotation of the motor to affect a thermal comfort level of an occupant of the space. The thermal comfort level of the occupant may be influenced by one or more of the metabolic rate of the occupant, the clothing insulation of the occupant, the air temperature, the mean radiant temperature, the air speed, and the humidity level. The control device may be configured to determine the present air temperature of the space and the humidity level using the temperature sensor and the humidity sensor of the ceiling fan 110, respectively (or possibly receive these measurements from an external device, such as thermostat 130). The control device may be configured to determine the air speed based on the known geometries of the blades 112, the present rotational speed of the blades, and the direction of rotation of the blades. The control device may be configured to determine the mean radiant temperature using the time of the day, weather conditions, and geographic location (e.g., as received from the system controller 140). The control device may be configured to estimate the clothing level/insulation of the occupant based on the geographic location, time of year, and weather conditions (e.g., as received from the system controller 140). The control device may be configured to infer the metabolic rate of the occupant by estimating a level of human activity of the occupant(s) in the space (e.g., based on the occupancy sensing circuits). The control device may be configured to calculate an estimated thermal comfort level of the occupant using one or more of these parameters (e.g., the metabolic rate of the occupant, the clothing level of the occupant, the present air temperature of the space, the mean radiant temperature, the air speed, and the humidity level) and control the rotational speed and/or direction of rotation of the motor to provide the airflow that provides "the best" comfort for the occupant, as describe below. If the control device is not able to measure, estimate, and/or calculate all of these parameters, the control device may be configured to make reasonable assumptions (e.g., configured to use default estimated values) about the value of these parameters to arrive at a reasonable solution.

Figure 2:
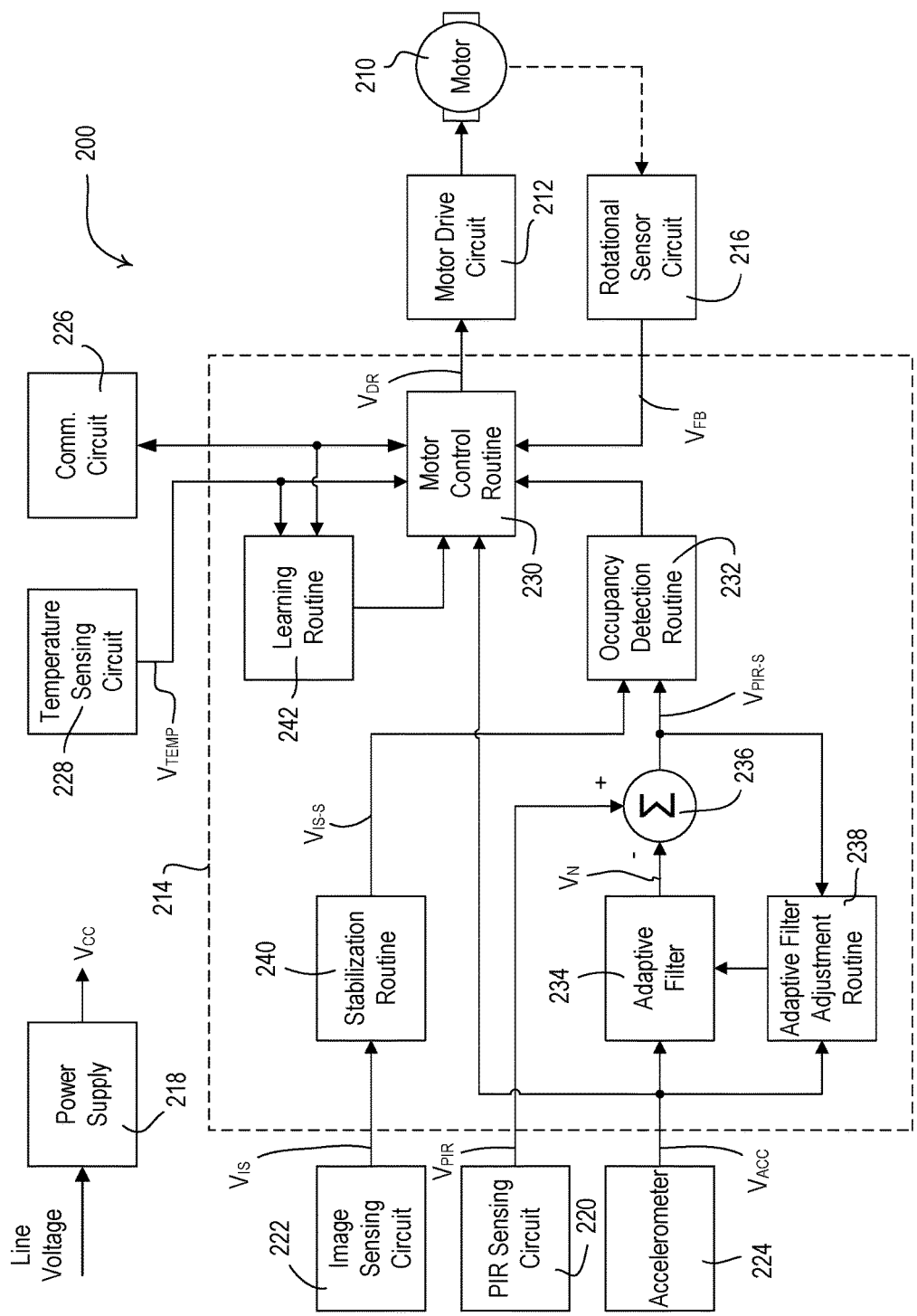
FIG. 2 is a block diagram of an example control device for controlling a motor of a ceiling fan located in a space.

FIG. 2 is a simplified block diagram of an example load control device, e.g., a control device 200, for controlling a motor 210 (e.g., a motor) of a ceiling fan (e.g., the ceiling fan 110 shown in FIG. 1) located in a space. The control device 200 may comprise a control circuit 214 (e.g., a digital control circuit) for controlling the motor 210 through a motor drive circuit 212. Examples of motor drive circuits are described in greater detail in commonly-assigned U.S. Pat. No. 7,330,004, issued Feb. 12, 2008, entitled METHOD AND APPARATUS FOR QUIET VARIABLE MOTOR SPEED CONTROL, and U.S. Pat. No. 7,489,094, issued Feb. 10, 2009, entitled METHOD AND APPARATUS FOR QUIET FAN SPEED CONTROL, the entire disclosures of which are hereby incorporated by reference.

The control circuit 214 may comprise, for example, one or more of a microprocessor, a programmable logic device (PLD), a microcontroller, an application specific integrated circuit (ASIC), a field-programmable gate array (FPGA), or any suitable processing device(s) or control circuit(s). The control circuit 214 may comprise a memory for storage of operational characteristics of the control device 200 as described herein. The memory may comprise an internal non-volatile memory of a microprocessor of the control circuit 214 or an external memory coupled to the microprocessor. The control circuit 214 may generate one or more drive signals $V_{DR}$ for controlling the motor drive circuit 212. The motor drive circuit 212 may receive line voltage from an alternating-current (AC) power source and may control the rotational speed and/or direction of rotation of the motor 210 in response to the drive signals $V_{DR}$ received from the control circuit 214.

The control circuit 214 may receive one or more motor feedback signals $V_{FB}$ that indicate a rotational speed and/or direction of rotation of the motor 210 from a rotational sensor circuit 216. The rotational sensor circuit 216 may comprise other suitable position sensors or sensor arrangements, such as, for example, Hall-effect, optical, or resistive sensors. The control circuit 214 may execute a motor control routine 230 for generating the drive signals $V_{DR}$ to control the rotational speed of the motor 210 in response to the motor feedback signals $V_{FB}$ received from the rotational sensor circuit 216. Examples of rotational sensing circuits are described in greater detail in commonly-assigned U.S. Pat. No. 7,839,109, issued Nov. 23, 2010, entitled METHOD OF CONTROLLING A MOTORIZED WINDOW TREATMENT, and U.S. Pat. No. 8,950,461, issued Feb. 10, 2015, entitled MOTORIZED WINDOW TREATMENT, the entire disclosures of which are hereby incorporated by reference.

The control device 200 may comprise a power supply 218 that may receive the line voltage and generate a direct-current (DC) supply voltage $V_{CC}$ for powering the control circuit 214 and the other low-voltage circuitry of the control device 200. If the motor 210 is a DC motor, the power supply 218 could also generate a DC bus voltage, which the motor drive circuit 212 could use to drive the motor (e.g., rather than the line voltage).

The control circuit 214 may execute an occupancy detection routine 232 (which may be a hardware, software, and/or firmware based module) for detecting an occupancy and/or vacancy condition in the space in which the ceiling fan (that is controlled by the motor drive unit 200) is located. The control circuit 214 may receive signals from one or more sensing circuits, e.g., a passive infrared (PIR) sensing circuit 220 and/or an image sensing circuit 222, which may be used by the occupancy detection routine 232 to determine the occupancy and/or vacancy conditions in the space. The motor control routine 230 may control the motor 210 in response to the determination of occupancy and/or vacancy conditions in the space by the occupancy detection routine 232. The control circuit 214 may communicate the occupancy and/or vacancy conditions to other devices of system 200 via communication circuit 226. The sensing circuits of the motor drive unit 200 may comprise additional and/or other types of occupancy sensing circuits or motion sensing circuits.

The PIR sensing circuit 220 may comprise, for example, a pyroelectric infrared detector for receiving infrared energy of an occupant that is moving in the space through a lens of the ceiling fan (e.g., the lens 118 of the ceiling fan 110 shown in FIG. 1). The PIR sensing circuit 220 may generate a PIR sense signal $V_{PIR}$ representative of the magnitude of the received infrared energy that is moving in the space. Examples of PIR sensing circuits are described in greater detail in commonly-assigned U.S. Pat. No. 8,228,184, issued Jul. 24, 2012, entitled BATTERY-POWERED OCCUPANCY SENSOR, the entire disclosure of which is hereby incorporated by reference.

The image sensing circuit 222 may be configured to generate one or more image sensing signals $V_{IS}$ that are representative of the sensed environmental characteristics of the space in which the ceiling fan 110 is installed (e.g., an occurrence of movement, an amount of movement, a direction of movement, a velocity of movement, a counted number of occupants, a light intensity, a light color, an amount of direct sunlight penetration, etc.). For example, the image sensing signals $V_{IS}$ may indicate the presence of an occupant in the space that is moving or not moving. The image sensing circuit 222 may allow for the detection of an occupant that is sleeping (e.g., not moving). For example, the image sensing circuit 222 may comprise a thermopile array that may sense absolute temperature. The image sensing circuit may be configured to generate one or more image sensing signals that indicate an entering of and/or exiting of an occupant.

The image sensing circuit 222 may be configured to generate one or more image sensing signals that indicate the presence and/or the activity levels of multiple occupants. The multiple occupants may be at various activity levels that are indicated by different moving states of the occupants.

For example, the image sensing circuit 222 may be configured to generate one or more image sensing signals that indicate a presence of a first occupant in the space that is a moving state, and the PIR sensor is configured to generate one or more PIR sense signals that indicate a presence of a second occupant in the space that is in a different moving state. The moving state of the first occupant and the moving state of the second occupant may indicate a level of occupant activities of the first occupant that is lower than the level of occupant activities of the second occupant.

The image sensing circuit 222 may also comprise, for example, a visible light sensing circuit, which may include an image recording circuit (such as a camera) and an image processing circuit (such as an image processor). The image processor may comprise a digital signal processor (DSP), a microprocessor, a programmable logic device (PLD), a microcontroller, an application specific integrated circuit (ASIC), a field-programmable gate array (FPGA), or any suitable processing device. The camera may be positioned towards the space in which one or more environmental characteristics are to be sensed (e.g., into the space in which the ceiling fan is located). The camera may be configured to record an image (e.g., through a lens). The image may be provided to the image processor. The image processor may be configured to process the image and provide the image sensing signals $V_{IS}$ to the control circuit 214. The image processor of the image sensing circuit 222 and/or the control circuit may include a chip (e.g., LC898111AXB) that performs image stabilization on the image sensing signal. When part of the control circuit, this chip may be represented by stabilization routine 240.

Vibrations and wobbling of the ceiling fan may introduce interference (e.g., noise) into the PIR sense signal $V_{PIR}$ and/or the image sensing signals $V_{IS}$. The control device 200 may further comprise a movement sensing device, e.g., an accelerometer 224, such as, a micro electro-mechanical systems (MEMS) accelerometer for generating an accelerometer output signal $V_{ACC}$ representative of the noise (e.g., indicating the magnitude and direction of the vibrations and wobbling of the ceiling fan). The accelerometer output signal may be a single dimensional signal or a multidimensional signal (e.g., having two axes in x and y directions or having three axes in x, y, and z directions). The single dimensional signal or a multidimensional signal may indicate a change in a quantifiable parameter that is measured within the MEMS device, such as, for example, a change in capacitance due to a deflection of a cantilevered beam within the MEMS device, or a change in temperature of an enclosed heated gas within the MEMS device, etc. The accelerometer output signal $V_{ACC}$ may be, for example, an oscillating (or sinusoidal) waveform having an amplitude and a frequency that are dependent upon the vibrations and wobbling of the ceiling fan. For example, the magnitude and direction of the vibrations and wobbling of the ceiling fan may be dependent upon the present rotational speed of the motor.

The control circuit 214 may use an adaptive noise cancelling algorithm to eliminate the effects of the noise (e.g., the vibrations and wobbling) on the PIR sense signal $V_{PIR}$ generated by the PIR sensing circuit 220. For example, the accelerometer may determine the wobbling as represented by signal $V_{ACC}$ and the control circuit 214 may filter this signal using an adaptive filter 234 (e.g., a digital filter) to generate a filtered noise signal $V_N$. The filtered noise signal $V_N$ may be subtracted from the PIR sense signal $V_{PIR}$ (e.g., by a summation function 236 of the control circuit) to generate a stabilized PIR sense signal $V_{PIR-S}$ that may indicate a detection of an occupancy and/or vacancy condition in the space by the PIR sensing circuit 220. The filtering characteristics of the adaptive filter 234 may be adjusted by an adaptive filter adjustment routine 238, for example, in response to both the accelerometer output signal $V_{ACC}$ and the stabilized PIR sense signal $V_{PIR-S}$. For example, the adaptive filter adjustment routine 238 may use a least mean squares (LMS) algorithm or other suitable algorithm for adjusting the filtering characteristics of the adaptive filter 234.

The PIR sensing circuit 220 may be located in a base portion (e.g., the base portion 114) of the fan. The lens for the PIR sensing circuit may be installed on a bottom surface of the base portion or any non-rotating surface (e.g., not on the fan blades) and directed into a space (e.g., a room) with a sufficient view (e.g., 360° view) of the space. Air flow may have an impact on the PIR sensing signal. For example, air flow may have less impact on the PIR sensing signal when the PIR sensing circuit 220 is located in the base of the fan than when the PIR sensing circuit is positioned at locations other than the base of the fan. A microwave doppler sensor may be used to increase robustness of a sensing signal against interference associated with the air flow.

The control circuit 214 may use a stabilization algorithm to eliminate the effects of the noise (e.g., the vibrations and wobbling) on the image sensing signals $V_{IS}$ generated by the image sensing circuit 222. For example, the control circuit 214 may process the image sensing signals $V_{IS}$ using a stabilization routine 240 to generate one or more stabilized image sensing signals $V_{IS-S}$. Stabilization routine 240 may be, for example, a chip (e.g., LC898111AXB) that performs image stabilization on the image sensing signal, although other chips and/or routines may be used. Again, stabilization routine 240 may be part of the image sensing circuit 222, or a combination thereof. The occupancy detection routine 232 may use the stabilized PIR sense signal $V_{PIR-S}$ and the stabilized image sensing signals $V_{IS-S}$ to determine an occupancy and/or vacancy condition in the space (e.g., occupancy sensing signal). The control circuit 214 may use the occupancy sensing signal to control the motor drive circuit to adjust the rotational speed of the motor. Again, the control circuit 214 may also or alternatively communicate the occupancy sensing to other devices of system 100.

The motor control routine 230 of the control circuit 214 may be configured to control the rotational speed and/or direction of rotation of the motor 210 in response to the accelerometer output signal $V_{ACC}$ generated by the accelerometer 224. The control circuit 214 may be configured to adjust the rotational speed of the motor 210 to minimize the magnitude of the wobble of the ceiling fan. For example, the control circuit 214 may be configured to adjust the rotational speed of the motor 210 to avoid rotational speeds at which the wobble is greatest. The control circuit 214 may be configured to calculate the magnitude of the wobble by calculating a root-mean square (RMS) value of the accelerometer output signal $V_{ACC}$ (e.g., to determine the energy of the wobble).

The control circuit 214 may be configured to determine (e.g., learn) the rotational speeds of the motor 210 at which the wobble is greatest during a configuration and/or setup procedure of the control device 200. For example, the control circuit 214 may be configured to step through various rotational speeds of the motor 210, calculate the magnitude of the wobble (e.g., by calculating the RMS value of the accelerometer output signal $V_{ACC}$) at each of the various speeds, compare the calculated magnitude of the wobble to a wobble threshold, and flag the specific rotational speed (e.g., in memory) if the magnitude of the wobble is greater than the wobble threshold. The control circuit 214 may be configured to avoid the flagged rotational speeds (and/or a region around the flagged rotational speeds) during normal operation of the control device 200. For example, if the control circuit 214 is presently increasing the rotational speed of the motor 210 and the desired rotational speed (e.g., a target rotational speed) is flagged, the control circuit may continue increasing the rotational speed of the motor until the next highest unflagged rotational speed is reached (or similarly, decrease the speed until an unflagged rotational speed is reached). Similarly, if the control circuit 214 is presently decreasing the rotational speed of the motor 210 and the desired rotational speed is flagged, the control circuit may continue decreasing the rotational speed of the motor until the next lowest unflagged rotational speed is reached (or similarly, increase the speed until an unflagged rotational speed is reached).

The control device 200 may also comprise a communication circuit 226, such as, a wired communication circuit or a wireless communication circuit (e.g., an RF transceiver coupled to an antenna for transmitting and/or receiving RF signals). Alternatively, the communication circuit 226 may include an RF receiver for receiving RF signals or an infrared (IR) receiver for receiving IR signals. The control circuit 214 may be coupled to the communication circuit 226 for transmitting and/or receiving digital messages. For example, the digital messages received via the communication circuit 226 may include commands for controlling the motor 210 or other information, such as an HVAC or thermostat mode (e.g., heating or cooling), a time of time and/or year, geographical location, weather information, etc. The motor control routine 230 of the control circuit 214 may be configured to control the rotational speed and/or direction of rotation of the motor 210 in response to the command(s) received via the communication circuit 226 (e.g., from the remote control device 120). The motor control routine 230 of the control circuit 214 may also be configured to adaptively adjust the rotational speed and/or direction of rotation of the motor 210 in response to the information (e.g., the HVAC or thermostat mode, the time of day and/or year, the geographical location, and/or the weather information) received via the communication circuit 226 (e.g., from the system controller 140). The control circuit 214 may also be able to transmit digital messages (e.g., including status information regarding the operation of the motor 210, occupancy and/or vacancy conditions, etc.) via the communication circuit 226 (e.g., to the system controller 140).

The control device 200 may further comprise a temperature sensing circuit 228 for measuring a present temperature in the space. The temperature sensing circuit 228 may be configured to generate a temperature sensing signal $V_{TEMP}$ that indicates the present temperature measured by the temperature sensing circuit 228. The motor control routine 230 of the control circuit 214 may be configured to control the rotational speed and/or direction of rotation of the motor 210 in response to the temperature sensing signal $V_{TEMP}$. In addition, the control device 200 may comprise a humidity sensing circuit (not shown) for measuring the humidity level in the space. Again, the control device 200 may alternatively receive this information via communications circuit 226 from an external device, such as thermostat 130. The control device 200 may also communicate any temperature and/or humidity level it measures to an external device via communications circuit 226.

The control circuit 214 may also execute a learning routine 242 for learning a preferred rotational speed for the motor 210. The control circuit 214 may be configured to learn a preferred rotational speed for the motor 210 based on use of the ceiling fan (e.g., frequent and/or repeated commands received via the communication circuit 226) and possibly also the present temperature in the space as measured by the temperature sensing circuit 228, for example. For example, the control circuit 214 may be configured to store a particular rotational speed as the preferred rotational speed if a user repeatedly controls the ceiling fan to the particular rotational speed when the present temperature in the space reaches a particular temperature. The control circuit 214 may also be configured to learn a preferred rotational speed for the motor 210 based on use of the ceiling fan (e.g., frequent and/or repeated commands received via the communication circuit 226) and other information, such as, the present time of day or year. Here again present temperature in the space may also be used.

The control circuit 214 may also be configured to control the rotational speed and/or direction of rotation of the motor 210 to affect a thermal comfort level of an occupant of the space. In spaces where temperature and/or humidity control (i.e., local HVAC control) are not available, changing the fan speed may be the only means for an occupant to adjust environmental conditions to affect thermal comfort. However, this process may also be used even for systems where temperature and/or humidity control is available, to automatically adjust the thermal comfort level of a room by adjusting the fan speed.

Figure 3:
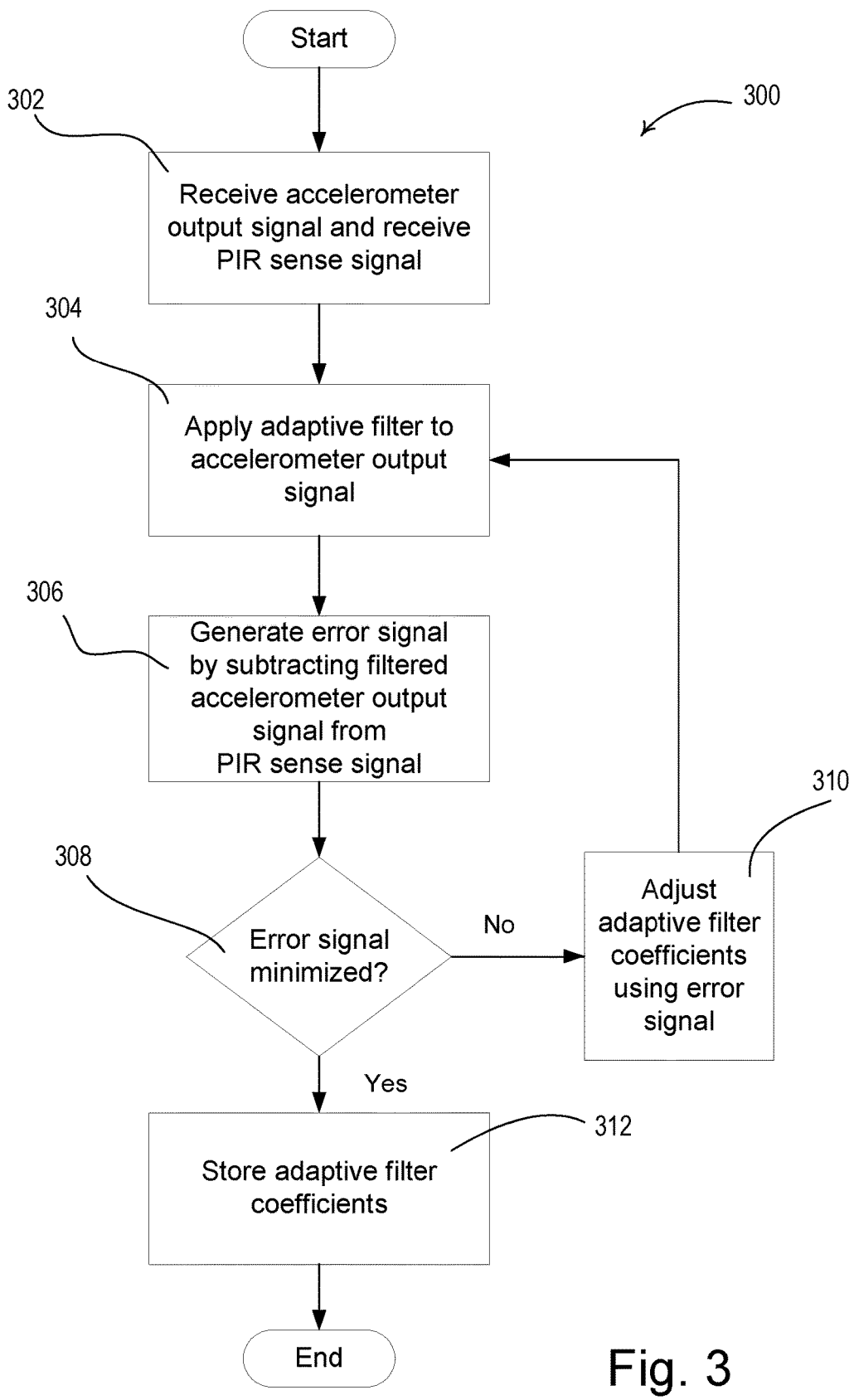
FIG. 3 illustrates an example process for determining the filtering characteristics of an adaptive filter.

FIG. 3 illustrates an example calibration process 300 for removing noise from the PIR sense signal due to vibrations or wobble of the fan by determining the appropriate transfer function (e.g., the adaptive filter 234) between the measured fan wobble and the corresponding noise in the PIR signal. The adaptive filter may be used to map the accelerometer output signal to align with the PIR sensing signal in phase and magnitude based on the determined adaptive filter coefficients. For example, the process 300 may be implemented as the adaptive filter adjustment routine 238.

The filtering characteristics of the adaptive filter may be calibrated during a vacancy condition (i.e., when the control circuit determines the room is not occupied) via an optimization algorithm to learn the appropriate adaptive filter coefficients. The filtering characteristics of the adaptive filter may be calibrated by adjusting one or more adaptive filter coefficients using the process 300. The one or more adaptive filter coefficients may be adjusted after a power-up of the control circuit 214.

The process 300 for calibrating the adaptive filter may start at 302, where the accelerometer output signal $V_{ACC}$ and the PIR sense signal $V_{PIR}$ are received by the control circuit. At 304, the control circuit may apply an adaptive filter to the accelerometer output signal $V_{ACC}$ to generate a filtered accelerometer output signal $V_N$. At 306, the filtered accelerometer output signal $V_N$ may be subtracted from the PIR sense signal $V_{PIR}$ to generate an error signal (which is represented by $V_{PIR-S}$ during calibration). For example, the error signal may indicate how well the accelerometer output signal $V_N$ aligns with the PIR sense signal $V_{PIR}$.

At 308, the control circuit may determine whether the error signal is minimized. For example, the error signal may be compared with a previous error signal that was obtained using the process described herein. If the error signal is not minimized, the process 300 may proceed to 310, where the one or more adaptive filter coefficients may be adjusted based on the error signal. The process 300 may proceed through 304-308 using the adjusted adaptive filter coefficients. If it is determined that the error signal is not minimized at 308, the process 300 may proceed to 310 to further adjust the adaptive filter coefficients. For example, the adjustment of the adaptive filter coefficients may be an iterative process until the error signal is minimized to a threshold (e.g., a zero error signal). The threshold may be predetermined and may be based on previous error measurements. As another alternative, the iterative process may continue until adjustment of the adaptive filter coefficients no longer change the error signal, or only result in delta change that is below a defined value. Other variations are possible. When the control circuit determines that the error signal has been minimized, the adjusted adaptive filter coefficients may be stored at 312. For example, the control circuit may store the adjusted adaptive filter coefficients in a volatile or non-volatile memory for later use. According to one example, process 300 may be performed at one representative fan speed (e.g., a medium level speed), and a single set of filter coefficients determined that are used for all fan speeds during normal operation of the fan. According to another example, process 300 may be performed multiple times at multiple various fan speeds (e.g., low, medium, and high), and set of filter coefficients determined for each speed. Thereafter, depending at which speed the fan is set at during normal operation of the fan, adaptive filter 234 is configured with the corresponding coefficients. According to one example, coefficients may be determined for every possible fan speeds. According to another example, coefficients may be determined for a representative set of fan speeds and one of the representative sets then used depending on the selected fan speed during normal operation (such as using the coefficients at the fan speed closest to selected fan speed. One will recognize other examples are possible.

Figure 4:
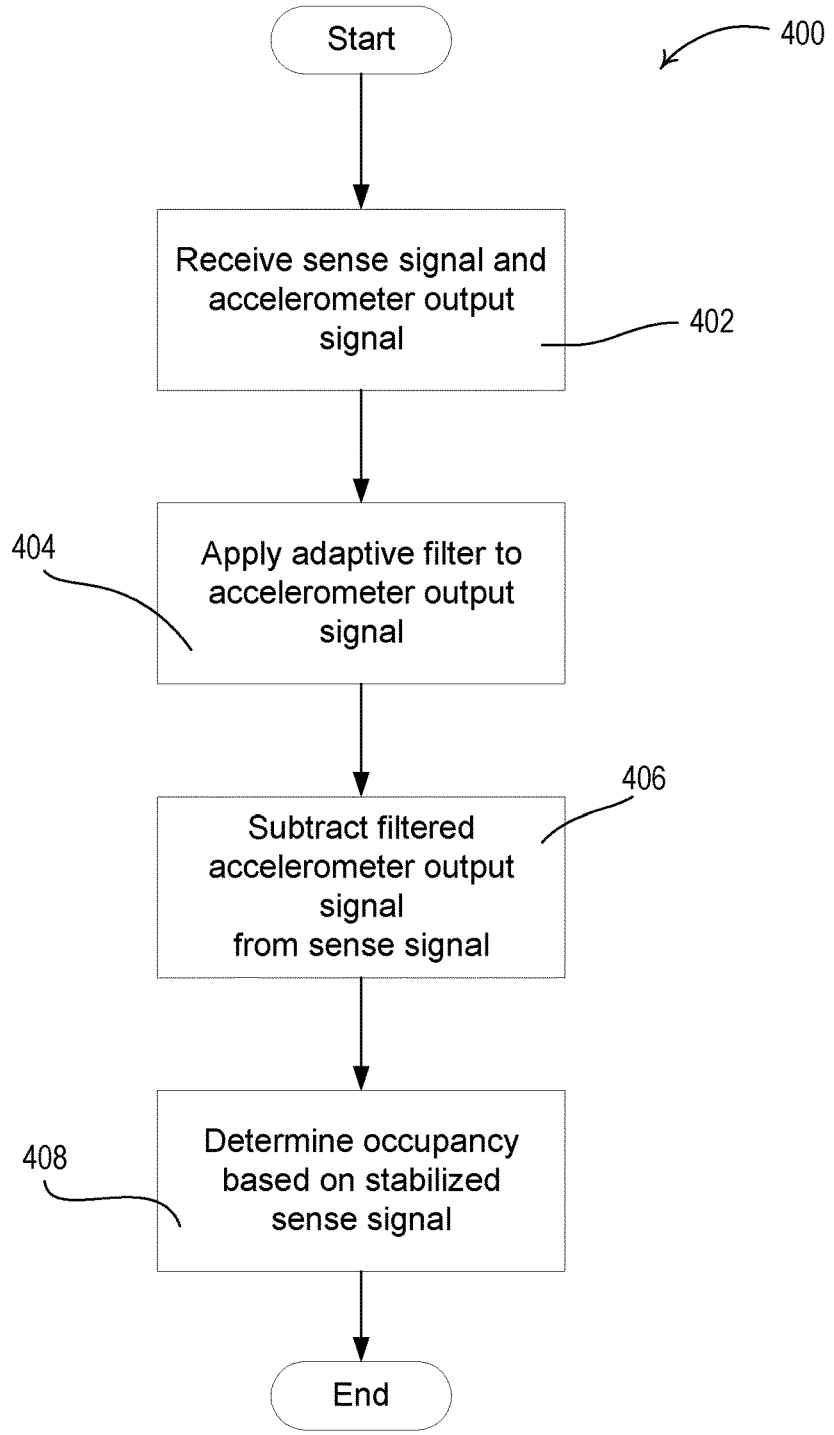
FIG. 4 illustrates an example process for filtering a sense signal using an adaptive filter.

FIG. 4 illustrates an example process 400 for routinely filtering a PIR sense signal using a filter such as an adaptive filter (i.e., once the control circuit is taken out of calibration mode). The process 400 may be used to stabilize a PIR sense signal by filtering out a noise signal included in the PIR sense signal.

The process 400 may start at 402 where an accelerometer output signal $V_{ACC}$ and a PIR sense signal $V_{PIR}$ are received. The adaptive filter may be applied to the accelerometer output signal $V_{ACC}$ to generate a filtered accelerometer output signal $V_N$ at 404. The adaptive filter may be characterized by one or more adaptive filter coefficients (e.g., the adjusted adaptive filter coefficients that were stored as described in FIG. 3). The filtered accelerometer output signal may be subtracted from the sense signal $V_{PIR}$ at 406 to generate a filtered sense signal $V_{PIR-S}$. The subtraction may be done by a summation function, such as the summation function 236, executed by the control circuit to generate a stabilized PIR sense signal $V_{PIR-S}$. At 408, the generated stabilized PIR sense signal $V_{PIR-S}$ may be used to detect an occupancy and/or vacancy condition in the space. Again, if multiple adaptive filter coefficients are determined for various fan speeds, the adaptive filter may be configured with the appropriate set of coefficients based on the selected fan speed at which the fan is operating.

Figure 5A:
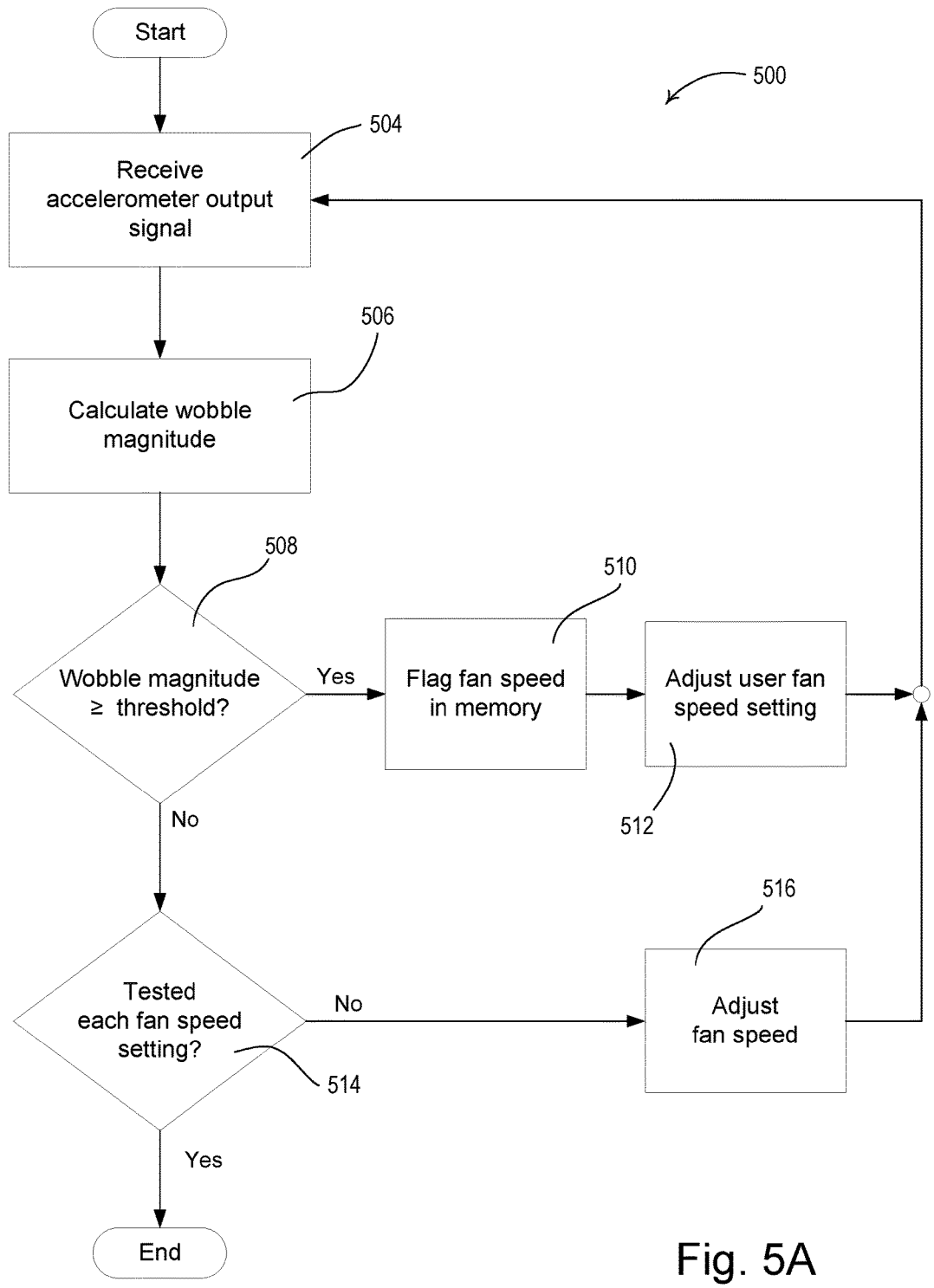
FIG. 5A illustrates an example process for adjusting a fan speed to minimize a wobbling of the fan.

FIG. 5A illustrates an example process 500 executed by the control circuit for adjusting a fan speed to minimize fan wobble. The process may be run over an entire range of user fan speed settings range (e.g., such as low, medium, and high) or a portion thereof. The process 500 may start at 504 at a first fan speed, where an accelerometer output may be received. At 506, the magnitude of the accelerometer output may be calculated to determine the magnitude of the fan wobble corresponding to the fan speed at which the fan is currently operating. At 508, the control circuit may determine whether the wobble magnitude has reached or exceeded a wobble threshold. The wobble threshold may be a pre-determined value. If the wobble magnitude reaches or exceeds the wobble threshold, the corresponding fan speed may be flagged in a memory at 510. In order to block or prevent this fan speed from occurring, at step 512, the current fan speed setting may be adjusted (i.e., the user fan speed setting may be slightly increased or decreased in an effort to remove the wobble) and the control circuit reconfigured such that if the fan is set the blocked speed, the adjusted speed is used in its place. Thereafter the process returns to step 504 where the adjusted speed is tested. On the contrary, if at step 508 the wobble magnitude is below the threshold, the process 500 may proceed to 514 where the control circuit may determine whether the range of fan speed settings have been tested. If the control circuit determines that at least one user fan speed setting had not been tested, the control circuit will adjust the fan speed at step 516 where the next fan speed setting may be tested. The process may continue until the entire range of user fan speed settings have been tested. When each fan speed in the range of user fan speed settings have been tested, process 500 may end.

Figure 5B:
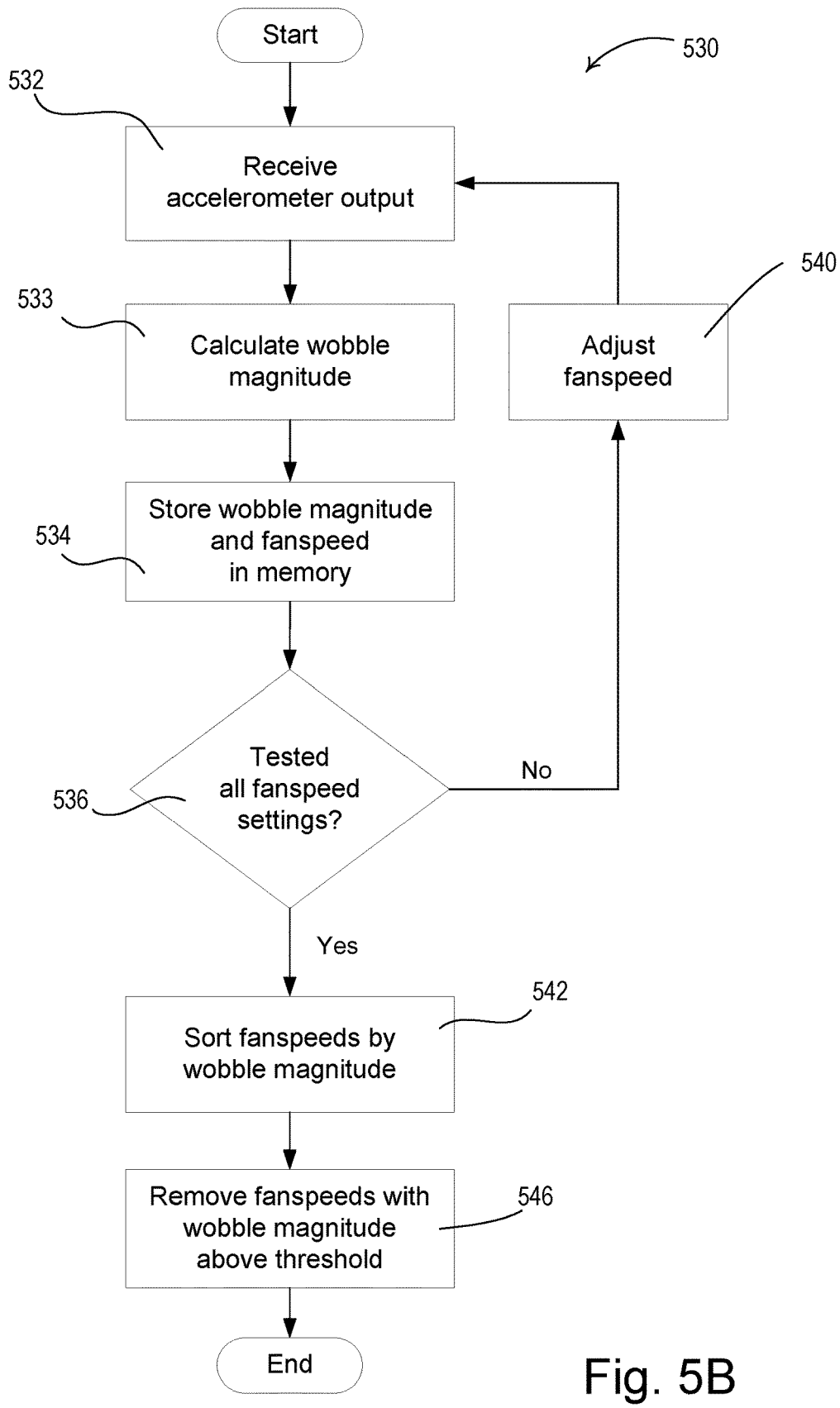
FIG. 5B illustrates another example process for adjusting a fan speed to minimize a wobbling of the fan.

FIG. 5B illustrates another example process 530 executed by the control circuit for adjusting the fan speed to minimize fan wobble. The process may be run over an entire range of user fan speed settings (e.g., such as low, medium, and high) or a portion thereof. The process 530 may start at 532 at a first fan speed where an accelerometer output may be received. At 533, the accelerometer output may be used to calculate a wobble magnitude corresponding to the fan speed at which the fan is operating. At 534, the wobble magnitude and the corresponding fan speed may be stored in memory. The process 530 may proceed to 536, where it may be determined whether the range of fan speed settings have all been tested. If each fan speed in the range of fan speed settings have yet to be tested (e.g., within a predetermined period of time or within the same testing process), the process 500 may proceed to adjust to a different fan speed at 540. The process 500 may proceed through 532-536 again to test another fan speed. If each fan speed in the range of fan speed settings are tested and the corresponding magnitudes of wobbling are stored, the process 530 may proceed to 542. At 542, the fan speed settings may be sorted, for example, based on the wobble magnitude. For example, the fan speed settings may be sorted into two categories. A first category of the fan speed settings may include fan speed settings corresponding to magnitudes of wobbling that reaches or exceeds a threshold value, for example. A second category of the fan speed settings may include fan speed settings corresponding to magnitudes of wobbling that are less than the threshold. At 546, the fan speed settings corresponding to magnitudes of wobbling that reaches or exceeds the threshold (e.g., the first category) may be blocked from user access. Additionally, the user fan speed settings may be rescaled such that the user has the same number of user fan speed settings available, wherein the user fan speed settings are all selected from the second category of fan speed settings with wobble magnitudes below the wobble threshold. For example, a fan with high, medium, and low user speed settings which is determined to have wobble above the threshold at the high setting, may have the previous medium setting set to the user fan speed "high" setting, and a fan speed between the previous low and medium fan settings may be selected as the new medium setting to rescale the fan speed options available to the user.

Figure 6:
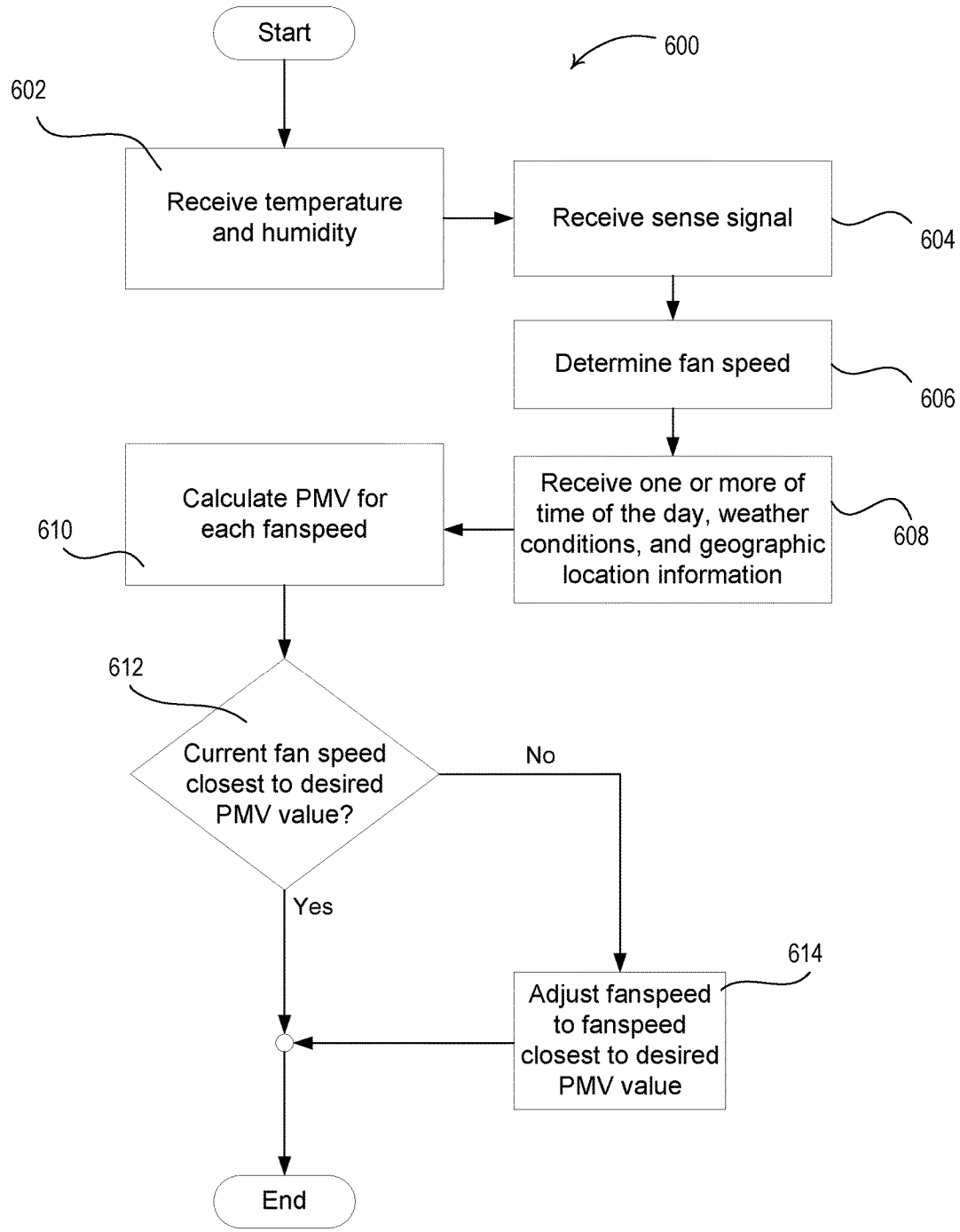
FIG. 6 is an example process for automatically adjusting fan speed to increase thermal comfort of an occupant.

FIG. 6 shows an example method 600 for adjusting the fan speed to maintain thermal comfort of an occupant. The procedure described in FIG. 6 may be executed periodically as the temperature and humidity are sampled. At step 602, the control circuit 214 may be configured to determine a present air temperature of the space, $t_a$, and a humidity level, $p_a$, using the temperature sensing circuit 228 and the humidity sensing circuit, respectively (or these values may be obtained from an external device). At step 604, the control circuit 214 may receive a sense signal indicating occupancy/vacancy conditions from the PIR and/or image sensing circuits. At step 606, the control circuit 214 may determine fan speed. At step 608 the control circuit may determine time of the day, weather conditions, and geographic location (e.g., as received from the system controller 140). Not all of these steps may be required. At step 610, the control circuit 214 may then calculate an estimated thermal comfort level of the occupant using a comfort equation and the Predicted Mean Vote (PMV) model, for example, which is described by ISO 7730 standard entitled, "Ergonomics of the thermal environment—Analytical determination and interpretation of thermal comfort using calculation of the PMV and PPD indices and local thermal comfort criteria" and which is described by ANSI/ASHRAE Standard 55 entitled, "Thermal Environmental Conditions for Human Occupancy". The thermal comfort equation is a heat balance equation which may be represented as equation [1] in FIG. 7. Equation [1] describes the balance between an occupant's metabolic rate (M), work (W), dry heat loss (H), evaporative heat exchange ($E_c$), respiratory convective heat exchange (Cres), and respiratory evaporative heat exchange ($E_{res}$), each of which may be further defined as shown in equations [2]-[7]. In addition to occupant specific factors, such as the metabolic rate and clothing insulation level ($I_{cl}$) of the occupant, the heat exchange variables may be dependent upon environmental conditions of the room, such as the present air temperature of the space ($t_a$), a mean radiant temperature ($t_r$), a relative mean air speed (e.g., an air flow level) ($v_{ar}$), and the humidity level ($p_a$). The clothing surface temperature ($t_{cl}$), may also be included.

Once having the comfort equation, it may then be used to calculate a PMV value using the PMV model which may be represented as shown in equation [8]. The PMV value predicts the mean thermal perception an occupant(s) from cold to hot valued on a seven-point scale from −3 to +3, respectively, for the given occupant specific factors and environmental conditions. Equation [9] describes the predicted percentage of dissatisfied (PPD) occupants, based on the PMV value.

According to one example, the PMV calculation may be simplified. For example, work, W, may be approximated as equal to zero. The clothing surface area factor $f_{cl}$ may be approximated as 1.63. The control circuit 214 may be configured to infer the metabolic rate of the occupant by estimating a level of human activity of the occupant (e.g., based on the PIR sensing circuit 220 and/or the image sensing circuit 222). The metabolic rate, M, may vary from 0.7 for an occupant with little movement (i.e., an occupant that is sleeping) to 10 for an occupant that is very active. A value for the metabolic rate may be chosen using the PIR sensor, for example. The PIR sensor may have count values which correspond to activity levels. For example, a room with no activity may have very low count values and a room that is occupied may have count values above an occupied threshold. The control circuit may use the count value from the PIR sensor to determine a metabolic rate. For example, when the room is occupied, a low PIR count value may mean that a person is sleeping, and a low metabolic rate, such as 0.7 or 1, may be used by the control circuit. A very high PIR count value close to the circuit maximum may correspond to a metabolic rate of 10, with medium values of PIR count scaled between 1 and 10 for metabolic rate. Similarly or alternatively, metabolic rate may be estimated from the image sensing circuit 222.

The control circuit 214 may be configured to determine the air speed, $v_a$, based on the known geometries of the fan blades (e.g., the blades 112), the present rotational speed of the motor 210, and the direction of rotation of the motor. The relative mean air speed, $v_{ar}$, may be approximated as equal to $v_a$. The control circuit 214 may be configured to estimate the mean radiant temperature $t_r$, using the time of the day, weather conditions, and geographic location (e.g., as received from the system controller 140), or the control circuit may approximate the mean radiant temperature as equal to the air temperature $t_a$.

The control circuit 214 may be configured to estimate the clothing insulation level $I_{cl}$ of the occupant based on the geographic location, time of year, and/or weather conditions (e.g., as received from the system controller 140). Id values are measured in units of [clo] and typically range from 0.5 [clo] for an occupant wearing shorts and a short sleeve shirt to 1 [clo] for an occupant wearing pants and a long sleeve shirt. Assuming a room temperature of 23° C., the control circuit may use a clothing insulation of based on the time of year and season as determined by the system controller, for example. For example, the control circuit may use a clothing insulation value of 0.5 for summer, 1.0 for winter, and 0.75 for spring or fall. Alternatively, the control circuit could use the outside weather conditions to determine the appropriate clothing insulation factor to use. For example, the control circuit could use a clothing insulation value of 0.5 for temperatures above a warm threshold (such as 28° C.), 1.0 for temperatures below a cold threshold (for example, 5° C.), and an intermediate clothing insulation value such as 0.75 between the hot and cold thresholds (i.e., between 5-28° C.).

e;.4qThe clothing surface temperature $t_{cl}$ may be calculated iteratively. According to another example, the clothing surface temperature may be estimated based on the activity level (metabolic rate) and the clothing insulation $I_{cl}$ value. Clothing surface temperature $t_{cl}$ is less than body temperature (approximately 37° C.). An increased clothing insulation level $I_{cl}$ will decrease the clothing surface temperature $t_{cl}$, and an active occupant will have a slightly higher $t_{cl}$ than when the occupant is inactive. Using these inputs, the clothing surface temperature $t_{cl}$ value may be approximated according to the example values in Table 1.0, which is based on a room temperature of 23° C. The activity level of the occupants may be determined based on the PIR counts and/or the metabolic rate. The control circuit may set an activity threshold, such that a metabolic rate or a PIR count above the activity threshold may be considered "active", and below the threshold, "inactive". For example, the activity threshold may be set at a metabolic rate of 5, and therefore, a metabolic rate of 7 may be considered active and a metabolic rate of 3 may be considered inactive. As another example, here the control device includes a thermopile array, the thermopile array may be used to measure an average $t_{cl}$ value.

TABLE 1.0

Estimated clothing surface temperature for various activity levels

| Activity Level | $I_{cl}$ [clo] | $t_{cl}$ [° C.] |
|---|---|---|
| Active | 0.5 | 30 |
| Inactive | 0.5 | 28 |
| Active | 0.75 | 29 |

TABLE 1.0-continued

Estimated clothing surface temperature
for various activity levels

| Activity Level | $I_{cl}$ [clo] | $t_{cl}$ [° C.] |
|---|---|---|
| Inactive | 0.75 | 27 |
| Active | 1.0 | 27 |
| Inactive | 1.0 | 25 |

The control circuit 214 may be configured to calculate the PMV using these calculated, measured, and estimated values described herein. The control circuit 214 may calculate the PMV for various fan speeds at step 604 using the air speed $v_a$ for each respective fan speed (for example, high, medium, low and off fan speeds). The control circuit 214 may determine at step 612 which fan speed provides a PMV value closest to a desired PMV value. When the current fan speed has a corresponding PMV value closest to the desired PMV value, the procedure may exit. If a fan speed other than the current fan speed has a PMV value closer to the desired PMV value than the PMV value of the current fan speed, the control circuit 214 may adjust the fan speed at step 614 to the fan speed at which the PMV value is closest to the desired PMV value.

Figure 8:
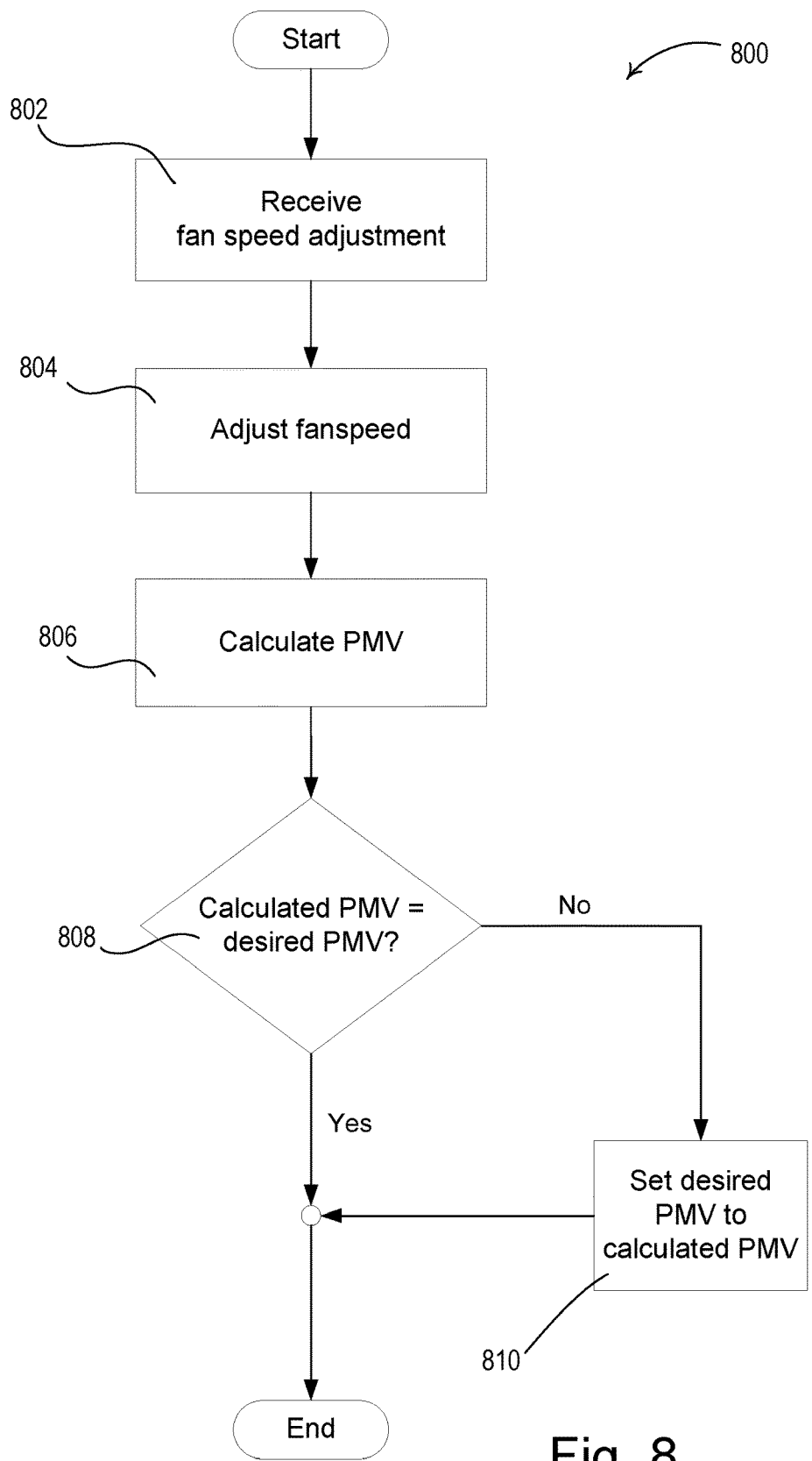
FIG. 8 is an example process for determining a desired PMV value based on user feedback.

The desired PMV value may be zero, or thermally neutral, or the desired PMV value may be adjusted based on a user preference. For example, a primary occupant of the space may feel most thermally comfortable at a PMV value of +2. FIG. 8 is an example learning procedure 800 executed by the control circuit whereby the desired PMV value may be adjusted. The control circuit may receive a fan speed adjustment command from the communication circuit 226 indicating that a user had adjusted the fan speed. The control circuit may adjust the fan speed via the motor drive circuit 212 at step 804, and may then proceed to calculate the PMV at step 806 as similarly described above. The control circuit may optionally wait a predetermined period of time before calculating the PMV to allow buffer time in the case where a user is dynamically adjusting the fan speed. For example, the predetermined amount of time may be 30 seconds. At step 806, the control circuit may determine whether the calculated PMV is equal to the desired PMV. If no desired PMV has previously been stored, the default desired PMV value may be zero. If the calculated PMV and the desired PMV are determined to be the same, the procedure may end. However, if the calculated PMV and the desired PMV are different, the control circuit may store the calculated PMV as the new desired PMV for future comparisons as described with respect to FIG. 7 for example.

Although features and elements are described herein in particular combinations, each feature or element can be used alone or in any combination with the other features and elements. The methods described herein may be implemented in a computer program, software, or firmware incorporated in a computer-readable medium for execution by a computer or processor. Examples of computer-readable media include electronic signals (transmitted over wired or wireless connections) and computer-readable storage media. Examples of computer-readable storage media include, but are not limited to, a read-only memory (ROM), a random access memory (RAM), removable disks, and optical media such as CD-ROM disks, and digital versatile disks (DVDs).

What is claimed is:

1. A ceiling fan in a space, comprising:
a motor drive circuit configured to control a rotational speed of a motor of the ceiling fan;
an occupancy sensing circuit configured to generate an occupancy signal; and
a control circuit configured to:
receive the occupancy signal from the occupancy sensing circuit;
determine a magnitude of wobbling of the ceiling fan based on an output signal;
process the received occupancy signal with the output signal to eliminate noise from the wobbling of the ceiling fan on the received occupancy signal;
detect an occupancy condition or a vacancy condition in the space in response to the processed occupancy signal; and
control the motor drive circuit to adjust the rotational speed of the motor of the ceiling fan in response to the detected occupancy or vacancy condition.

2. The ceiling fan of claim 1, wherein the occupancy sensing circuit comprises an image sensing circuit configured to record an image of the space, the control circuit configured to detect an occupancy condition or a vacancy condition in the space in response to the image sensing circuit and to control the motor drive circuit to adjust the rotational speed of the motor of the ceiling fan in response to the detected occupancy or vacancy condition.

3. The ceiling fan of claim 1, wherein the occupancy sensing circuit comprises a passive infrared (PIR) sensing circuit configured to generate a PIR sense signal that indicates the occupancy condition or the vacancy condition in the space, the control circuit configured to control the motor drive circuit to adjust the rotational speed of the motor in response to the PIR sense signal.

4. The ceiling fan of claim 2, wherein the image sensing circuit comprises an image capturing circuit configured to record the image and an image processor configured to process the image from the image capturing circuit and wherein the occupancy signal is an image sensing signal that is provided to the control circuit.

5. The ceiling fan of claim 2, further comprising:
a movement sensing device configured to generate the output signal that indicates a magnitude of wobbling of the ceiling fan;
wherein the control circuit is configured to process the occupancy signal and the output signal using a stabilization algorithm to eliminate the noise from the wobbling of the ceiling fan on the occupancy signal.

6. The ceiling fan of claim 2, wherein the image sensing circuit comprises a thermopile array.

7. The ceiling fan of claim 2, wherein the image sensing circuit is configured to generate one or more image sensing signals that indicate presence of an occupant in the space that is not moving.

8. The ceiling fan of claim 3, further comprising:
a movement sensing device configured to generate an output signal that indicates of a magnitude of wobbling of the ceiling fan;
wherein the control circuit is configured to process the PIR sense signal and the output signal using an adaptive noise cancelling algorithm to eliminate the noise from the wobbling of the ceiling fan on the PIR sense signal.

9. The ceiling fan of claim 4, wherein the image capturing circuit comprises a camera positioned towards the space.

10. A motor control device for a ceiling fan in a space, the motor control device comprising:
an occupancy sensing circuit configured to generate an occupancy sensing signal;

a motor drive circuit configured to control a rotational speed of a motor of the ceiling fan;

a movement sensing device configured to generate an output signal that indicates a magnitude of wobbling of the ceiling fan; and a control circuit configured to:
- determine a magnitude of wobbling of the ceiling fan based on an output signal;
- process the occupancy signal with the output signal to eliminate noise from the wobbling of the ceiling fan on the occupancy signal; and
- detect an occupancy condition or a vacancy condition in the space in response to the processed occupancy signal.

11. The motor control device of claim 10, wherein the control circuit is further configured to control the motor drive circuit to adjust the rotational speed of the motor of the ceiling fan in response to the processed occupancy signal.

12. The motor control device of claim 10, further comprising:
- a passive infrared (PIR) sensing circuit configured to generate a PIR sense signal that indicates an occupancy condition or a vacancy condition in the space;
- wherein the control circuit is configured to:
  - control the motor drive circuit to adjust the rotational speed of the motor in response to the PIR sense signal; and
  - process the PIR sense signal and the output signal using an adaptive noise cancelling algorithm to eliminate noise from the wobbling of the ceiling fan on the PIR sense signal.

13. The motor control device of claim 10, wherein the control circuit is configured to control the motor drive circuit to adjust the rotational speed of the motor to avoid rotational speeds at which the magnitude of the wobbling is greatest.

14. The motor control device of claim 10, wherein the control circuit is configured to control the motor drive circuit to adjust the rotational speed of the motor in response to the output signal to minimize the magnitude of the wobbling of the ceiling fan.

15. The motor control device of claim 10, wherein the movement sensing device comprises an accelerometer.

16. The motor control device of claim 11, wherein the occupancy sensing circuit comprises an image sensing circuit, wherein the image sensing circuit comprises:
- an image capturing circuit configured to record an image of the space; and
- an image processor configured to process the image from the image capturing circuit and generate an image sensing signal that is provided to the control circuit.

17. The motor control device of claim 12, wherein the adaptive noise cancelling algorithm comprises an adaptive filter having one or more filter coefficients, and wherein the control circuit is configured to:
- filter the output signal via the adaptive filter; and
- update the one or more filter coefficients of the adaptive filter using a least means squares algorithm.

18. The motor control device of claim 13, wherein the control circuit is configured to learn the rotational speeds of the motor at which the magnitude of the wobbling is greatest during a configuration procedure of the motor control device.

19. The motor control device of claim 15, wherein the accelerometer comprises a micro-electro-mechanical systems (MEMS) accelerometer.

20. The motor control device of claim 16, wherein the control circuit is configured to process the image sensing signal and the output signal using a stabilization algorithm to eliminate noise from the wobbling of the ceiling fan on the image sensing signal.

21. The motor control device of claim 16, wherein the image capturing circuit comprises a camera positioned towards the space.

22. The motor control device of claim 16, wherein the image sensing circuit comprises a thermopile array.

23. The motor control device of claim 16, wherein the image sensing circuit is configured to generate an image sensing signal that indicates presence of an occupant in the space.

24. A motor control device for a ceiling fan in a space, the motor control device comprising:
- a motor drive circuit configured to control a rotational speed of a motor of the ceiling fan;
- a wireless communication circuit configured to receive a wireless signal;
- a control circuit configured to:
  - receive, via the wireless communication circuit, a wireless signal comprising a first command to control the rotational speed of the motor of the ceiling fan to a particular rotational speed;
  - in response to receiving the first command, determine a first parameter, wherein the first parameter comprises at least one of: a present time of day, a present time of year, and a present temperature;
  - control the motor drive circuit to adjust the rotational speed of the motor of the ceiling fan in response to the received first command; and
  - receive, via the wireless communication circuit, a subsequent wireless signal comprising a second command to control the rotational speed of the motor of the ceiling fan to a particular rotational speed, wherein the second command is the same as the first command;
  - determine a second parameter wherein the second parameter comprises at least one of: a present time of day, a present time of year, and a present temperature;
  - determine whether the second parameter is the same as the first parameter; and
  - based on the determination that the second parameter is the same as the first parameter, store the particular rotational speed as the preferred rotational speed for the motor of the ceiling fan corresponding to the second parameter.

25. The motor control device of claim 24, wherein the first parameter and the second parameter comprise a present temperature of the space.

26. The motor control device of claim 24, wherein the first parameter and the second parameter comprise a present time of day.

* * * * *